United States Patent
Park et al.

(10) Patent No.: US 11,246,219 B2
(45) Date of Patent: Feb. 8, 2022

(54) FLEXIBLE PRINTED CIRCUIT BOARD AND DISPLAY DEVICE INCLUDING THE SAME

(71) Applicant: Samsung Display Co., Ltd., Yongin-si (KR)

(72) Inventors: John Park, Seoul (KR); Seung-Woo Kang, Seongnam-si (KR); Soon-Sung Park, Asan-si (KR); Jun Ho Park, Goyang-si (KR); Yong Uk Song, Seoul (KR); Su Chang Ryu, Yongin-si (KR); Jung Soo Youn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/918,946

(22) Filed: Jul. 1, 2020

(65) Prior Publication Data
US 2021/0161016 A1    May 27, 2021

(30) Foreign Application Priority Data
Nov. 25, 2019  (KR) .................. 10-2019-0152403

(51) Int. Cl.
| H05K 1/00 | (2006.01) |
| H05K 1/18 | (2006.01) |
| H05K 1/11 | (2006.01) |
| H05K 3/32 | (2006.01) |
| G06F 3/041 | (2006.01) |

(52) U.S. Cl.
CPC ............ *H05K 1/189* (2013.01); *G06F 3/0412* (2013.01); *H05K 1/118* (2013.01); *H05K 3/323* (2013.01); *H05K 2201/10128* (2013.01)

(58) Field of Classification Search
CPC ........ H05K 1/189; H05K 1/118; H05K 3/323; G06F 3/0412
USPC ...................................................... 361/749
See application file for complete search history.

(56) References Cited

U.S. PATENT DOCUMENTS

| 7,447,040 B2 | 11/2008 | Kim |
| 2009/0014204 A1 | 1/2009 | Wang et al. |
| 2013/0133930 A1* | 5/2013 | Watanabe ............ H05K 1/0281 174/254 |
| 2019/0006141 A1* | 1/2019 | Tsumagari ............... H05K 1/16 |

FOREIGN PATENT DOCUMENTS

| KR | 10-2007-0031129 | 3/2007 |
| KR | 10-2019-0081950 | 7/2019 |

* cited by examiner

*Primary Examiner* — Andargie M Aychillhum
(74) *Attorney, Agent, or Firm* — H.C. Park & Associates, PLC

(57) ABSTRACT

A flexible printed circuit board including: a base film; an electrode pad disposed on one side of the base film; a circuit pattern connected with the electrode pad; a coverlay that overlaps at least a part of the circuit pattern; and a cover resin that overlaps the circuit pattern and at least a part of the coverlay. The coverlay includes a body portion and a protrusion protruded from the body portion.

19 Claims, 7 Drawing Sheets

FLEXIBLE PRINTED CIRCUIT BOARD AND DISPLAY DEVICE INCLUDING THE SAME

CROSS-REFERENCE TO RELATED APPLICATION

This application claims priority from and the benefit of Korean Patent Application No. 10-2019-0152403, filed on Nov. 25, 2019, which is hereby incorporated by reference for all purposes as if fully set forth herein.

BACKGROUND

Field

Exemplary embodiments of the invention relate generally to a flexible printed circuit board and, more specifically, to a display device including the same.

Discussion of the Background

A display device, such as a liquid crystal display (LCD), an organic light emitting diode (OLED) display, and the like includes a display panel where an image is displayed and a driver such as a gate driver, a data driver, and the like for driving the display panel. The data driver may be provided in a form of a separate chip and thus, may be electrically connected to the display panel. The gate driver may be integrated with the display panel rather than being provided as a chip. Alternatively, the display device may include a touch panel and a touch driver for driving the touch panel.

The display panel or the touch panel includes a pad region where pads for receiving external signals are arranged, and an electronic part, such as a flexible printed circuit board, is bonded to the pad region.

The above information disclosed in this Background section is only for understanding of the background of the inventive concepts, and, therefore, it may contain information that does not constitute prior art.

SUMMARY

Exemplary embodiments of the present invention provide a printed circuit board that effectively prevents permeation of foreign particles or moisture, and a display device including the same.

Additional features of the inventive concepts will be set forth in the description which follows, and in part will be apparent from the description, or may be learned by practice of the inventive concepts.

An exemplary embodiment of the present invention provides a flexible printed circuit board including: a base film; an electrode pad that is disposed on one side of the base film; a circuit pattern that is connected with the electrode pad; a coverlay that overlaps at least a part of the circuit pattern; and a cover resin that overlaps the circuit pattern and at least a part of the coverlay. The coverlay includes a body portion and a protrusion protruded from the body portion.

The cover resin may overlap the protrusion portion.

The cover resin may overlap at least a part of the body portion.

At least a part of the circuit pattern may overlap the coverlay.

The cover layer may include a plurality of protrusion portions.

The plurality of protrusion portions may be disposed apart from each other at regular intervals.

The cover resin may be distanced from the electrode pad on a plane.

The coverlay may be distanced from the electrode pad on a plane.

Another exemplary embodiment of the present invention provides a display device including: a display panel that includes a display area and a non-display area; and a flexible printed circuit board that is coupled with the display panel in the non-display area. The flexible printed circuit board includes a base film, an electrode pad that is disposed on one side of the base film, a circuit pattern that is connected with the electrode pad, a coverlay that overlaps at least a part of the circuit pattern; and a cover resin that overlaps the circuit pattern and at least a part of the coverlay, and wherein the overlay includes a body portion and a protrusion portion protruded from the body portion.

The display panel may include a pad portion located in the non-display area, and the pad portion may be electrically connected with the electrode pad.

The display device may further include an anisotropic conductive film that is located between the pad portion and the electrode pad.

The anisotropic conductive film may be distanced from the cover resin on a plane.

The anisotropic conductive film is distanced from the coverlay on a plane.

The cover resin may overlap the protrusion portion.

The cover resin may overlap at least a part of the body portion.

At least a part of the circuit pattern may overlap the coverlay.

The coverlay may include a plurality of protrusion portions.

Another exemplary embodiment of the present invention provides a display device including: a touch panel that includes a touch area and a peripheral area; and a flexible printed circuit board that is coupled with the touch panel in the peripheral area. The flexible printed circuit board includes a base film, an electrode pad that is disposed on one side of the base film, a circuit pattern that is connected with the electrode pad, a coverlay that overlaps at least a part of the circuit pattern, and a cover resin that overlaps the circuit pattern and at least a part of the coverlay. The coverlay includes a body portion and a protrusion portion protruded from the body portion.

The touch panel may include a pad portion that is located in the peripheral area, and the pad portion may be electrically connected with the electrode pad.

The display device may further include an anisotropic conductive film that is disposed between the pad portion and the electrode pad.

The exemplary embodiments can provide a flexible printed circuit board that effectively prevents permeation of foreign particles or moisture. Reliability of a display device including the flexible printed circuit board can be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
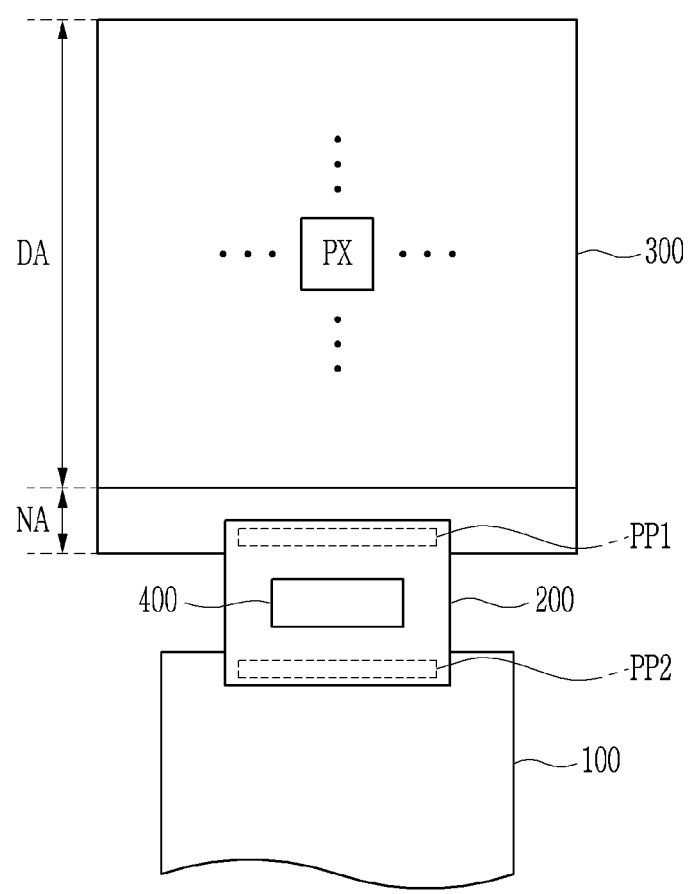
FIG. 1 is a schematic top plan view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, in this specification, the phrase "on a plane" means viewing a target portion from the top, and the phrase "on a cross-section" means viewing a cross-section formed by vertically cutting a target portion from the side.

Figure 2:
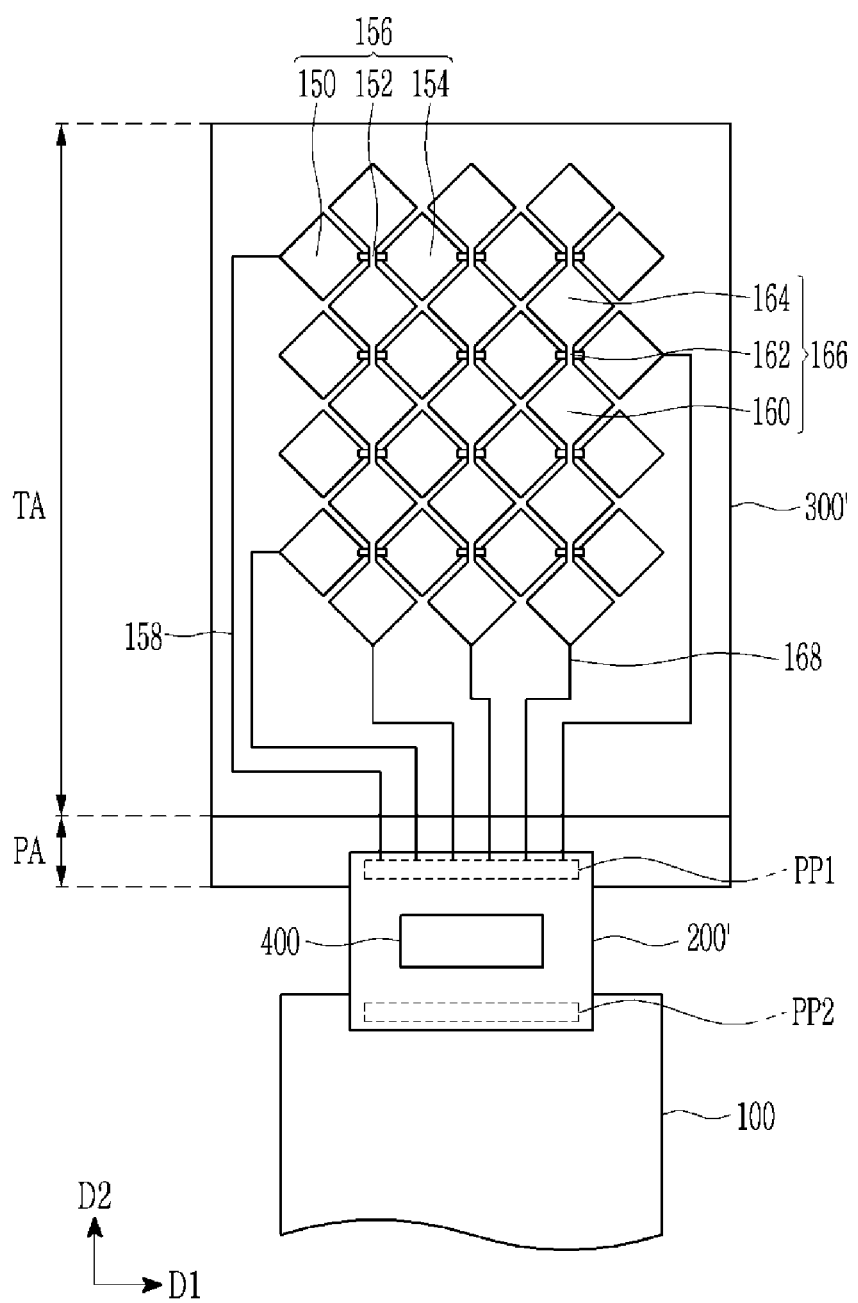
FIG. 2 is a schematic top plan view of a display device according to an exemplary embodiment of the present invention.

Hereinafter, a display device according to an exemplary embodiment will be described with reference to FIG. 1 and FIG. 2. FIG. 1 is a schematic top plan view of a display device according to an exemplary embodiment, and FIG. 2 is a top plan view of the display device according to the exemplary embodiment.

Referring to FIG. 1, a display device according to an exemplary embodiment includes a display panel 300, a flexible printed circuit board 200 connected to the display panel 300, and a printed circuit board 100 connected to the flexible printed circuit board 200. The display panel 300 may be an organic light emitting panel or a liquid crystal panel, but the inventive concepts are not so limited.

The display panel 300 includes a display area DA where an image is displayed, and a non-display area NA that is disposed at an outer edge of the display area DA. The non-display area NA contains elements and/or wires for generation and/or transmission of various signals applied to the display area DA. In FIG. 1, one edge area of the display panel 300, that is, a lower side area of the display panel 300, is illustrated as the non-display area NA, but another edge area of the display area 300, for example, left and right edge areas and/or an upper edge area, may correspond to the non-display area NA. The display area DA is illustrated as a quadrangle, but the display area DA may have various shapes such as a circle, an oval, a polygon, and the like, other than the quadrangle.

A plurality of pixels PX are arranged, for example, in a matrix format, in the display panel 300. Signal lines such as gate lines (not shown), data lines (not shown), and the like are also disposed in the display area DA. The gate lines may extend substantially in a row direction (i.e., a horizontal direction), and the data lines may extend substantially in a column direction (i.e., a vertical direction). Each pixel PX is connected with the gate line and the data line and may receive a gate signal and a data signal from the signal lines. In case of the organic light emitting diode (OLED) display, for example, driving voltage lines (not shown) that extend substantially in the column direction and transmit a driving voltage to the pixels PX may be disposed.

A pad portion PP1 where electrodes for receiving external signals of the display panel 300 are disposed in the non-display area NA of the display panel 300. One end of the flexible printed circuit board 200 is connected to the pad portion PP1. The other end of the flexible printed circuit board is connected with a pad portion PP2 of the printed circuit board 100, and the printed circuit board 100 may transmit a signal, for example, image data and the like.

A driving device that generates and/or processes various signals for driving the display panel 300 may be located in the non-display area NA or the flexible printed circuit board 200 of the display panel 300, or may be located in an external printed circuit board. The driving device may include a data driver that applies a data signal to the data line, a gate driver that applies a gate signal to the gate line, and a signal control portion that controls the data driver and the gate driver.

According to the exemplary embodiment, the data driver may be installed in the form of an integrated circuit chip 400 and connected to the pad portion PP1. However, unlike what is shown in the drawing, the data driver may be installed in the form of the integrated circuit chip in the non-display area NA between the display area DA and the pad portion PP1. The gate driver may be integrated with a non-display area (not shown) at the left and/or right edge of the display panel 300, or may be provided in the form of an integrated circuit chip. The signal control portion may be formed in the integrated circuit chip 400 with the data driver, or may be provided as a separate integrated circuit chip.

Next, referring to FIG. 2, a display device according to an exemplary embodiment may include a touch panel 300'. The touch panel 300' may include a touch area TA and a peripheral area PA. A first electrode pattern portion 156 and a second electrode pattern portion 166, which serve as location sense electrodes, may be disposed in the touch area TA of the touch panel 300'. Any descriptions of the same components as those described with reference to FIG. 1 may be omitted.

A plurality of the first electrode pattern portions 156 may be provided in a first direction D1. Here, the first direction may be, for example, an x-axis direction. The first electrode pattern portions 156 include first sensor electrodes 150 and 154 that are formed in the shape of a rhombus or a diamond, and bridges 152 that connect adjacent first sensor electrodes 150 and 154. In addition, the first sensor electrodes 150 and 154 are electrically connected with first signal wires 158 and receive a driving voltage through a first touch pad disposed in a pad portion PP1.

A plurality of the second electrode pattern portions 166 may be provided in a second direction D2 such that the second electrode pattern portions 166 cross the first electrode pattern portions 156. Here, the second direction may be, for example, a Y-axis direction. The second electrode pattern portions 166 may include second sensor electrodes 160 and 164 that are formed in the shape of a rhombus or a diamond, and connection portions 162 that are disposed in the same layer as the second sensor electrodes 162 and 164 and connect second sensor electrodes 160 and 164 that are adjacent to each other in the second direction. The second sensor electrodes 160 and 164 are electrically connected with second signal wires 168 and supply a voltage or a current that is changed according to whether or not a touch is carried out to a second touch pad located in the pad portion PP1.

The pad portion PP1 where electrodes that transmit or receive a signal from or to the outside of the touch panel 300' are disposed is located in the peripheral area PA. One end of a flexible printed circuit board 200' is connected to the pad portion PP1. The other end of the flexible printed circuit board 200' is connected to a pad portion PP2 of the printed circuit board 100.

The pad portion PP1 may include a first touch pad connected with the first signal wire 158 and a second touch pad connected with the second signal wire 168.

The pad portion PP1 located in the non-display area NA of the display panel 300 and the flexible printed circuit board 200 may be connected as described with reference to FIG. 1, or the pad portion PP1 located in the peripheral area PA of the touch panel 300' and the flexible printed circuit board 200' may be connected as described with reference to FIG. 2. Hereinafter, the flexible printed circuit boards 200 and 200' connected with the display panel 300 or the touch panel 300' will be described.

Figure 3:
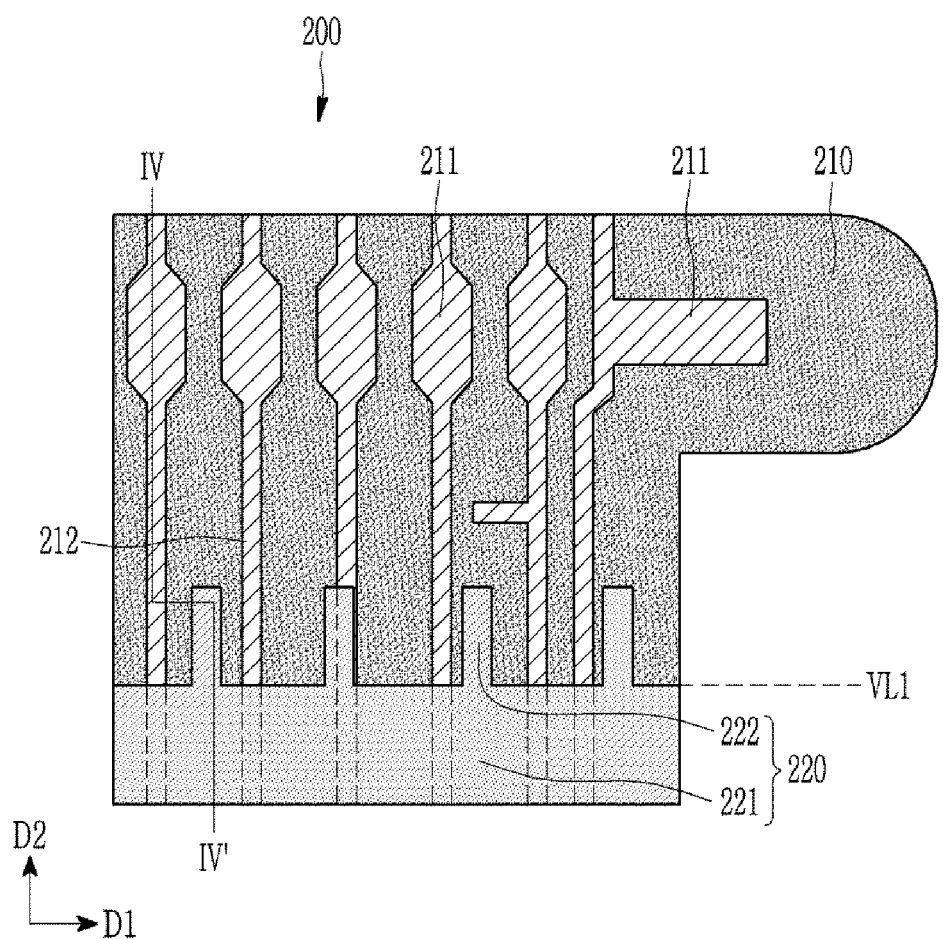
FIG. 3 is a top plan view of some constituent elements of a flexible printed circuit board according to an exemplary embodiment of the present invention.
Figure 4:
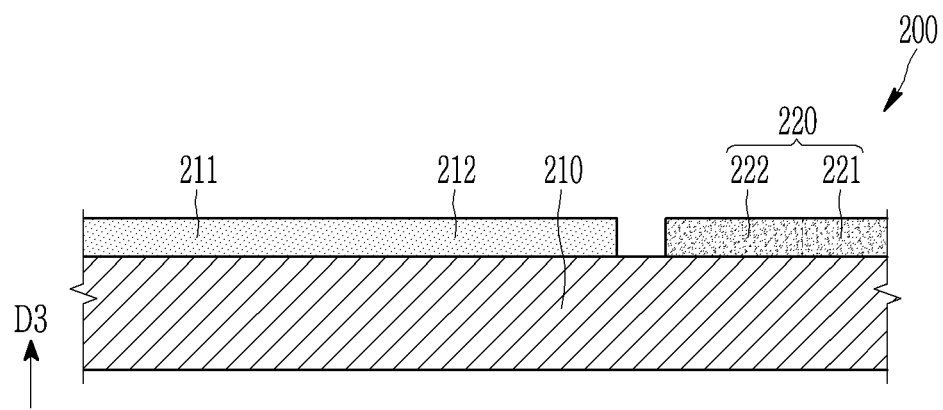
FIG. 4 is a cross-sectional view of FIG. 3, taken along the line IV-IV'.
Figure 5:
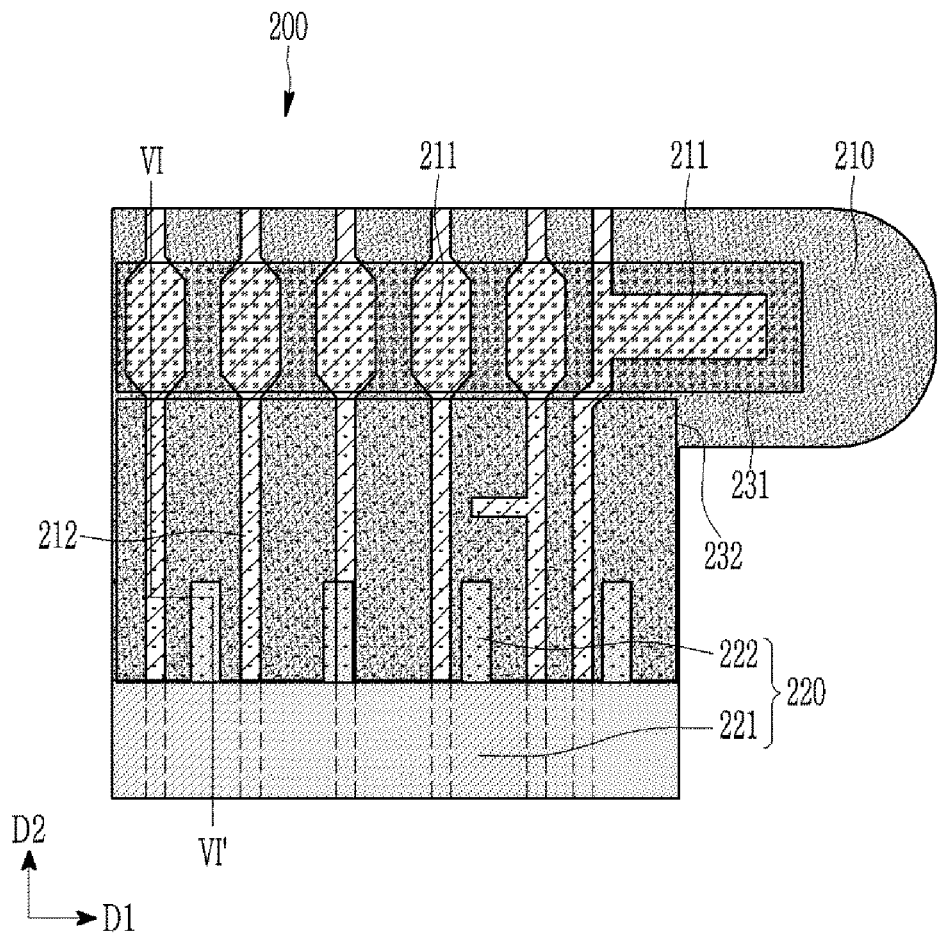
FIG. 5 is a top plan view of some constituent elements of the flexible printed circuit board according to the exemplary embodiment of the present invention t.
Figure 6:
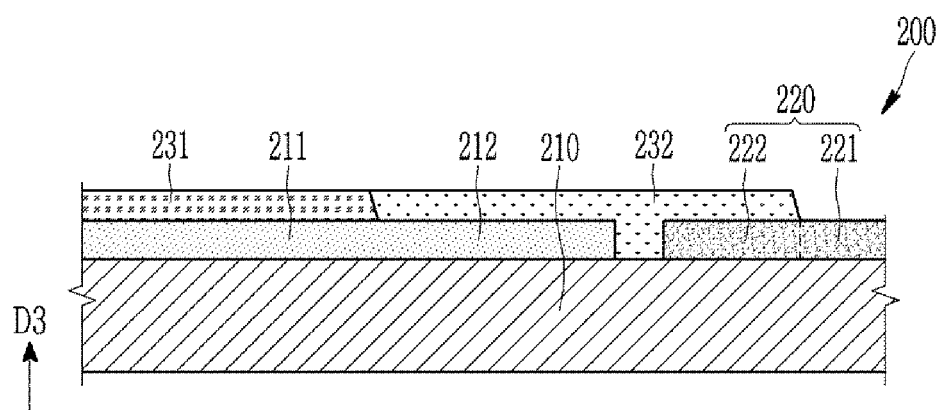
FIG. 6 is a cross-sectional view of FIG. 5 taken along the line VI-VI'.

Hereinafter, the flexible printed circuit board 200 according to the exemplary embodiment will be described with reference to FIG. 3 to FIG. 6. FIG. 3 is a top plan view of some constituent elements of the flexible printed circuit board according to the exemplary embodiment; FIG. 4 is a cross-sectional view of FIG. 3 taken along the line IV-IV', FIG. 5 is a top plan view of some constituent elements of the flexible printed circuit board according to the exemplary embodiment; and FIG. 6 is a cross-sectional view of FIG. 5 taken along the line VI-VI'.

First, referring to FIG. 3 and FIG. 4, the flexible printed circuit board 200 according to the exemplary embodiment includes a base film 210, electrode pads 211, circuit patterns 212, and a coverlay 220.

The base film 210 is a portion that becomes a body of the flexible printed circuit board 200, and may be formed of a material such as polyimide and the like. The base film 210 may have a thickness of about 20 um, but the inventive concepts are not so limited. The thickness of the base film 210 may be in a range such that the flexible printed circuit board 200 is not deformed while considering flexibility and rigidity at the same time.

The electrode pads 211 and the circuit patterns 212 that are connected with the electrode pads 211 are located on one side of the base film 210. The electrode pads 211 and the circuit patterns 212 are formed of a material such as copper (Cu) and the like. For example, copper (Cu) on the base film 210 may be formed through a patterning process. In addition, although not illustrated, the electrode pad 211 and the circuit pattern 212 may have a multi-layered structure such that they may be connected with each other through a hole, while disposing an insulation layer therebetween.

The electrode pad 211 may overlap the pad portion PP1 of the display panel or the touch panel, and may be electrically connected with an electrode or a touch pad disposed in the pad portion PP1. As shown in FIG. 3, the flexible printed circuit board 200 according to the exemplary embodiment may include the plurality of electrode pads 211, which are arranged in parallel with each other along the same direction. The plurality of electrode pads 211 may have various shapes on a plane.

The circuit pattern 212 may be physically and electrically connected with the electrode pad 211. The circuit pattern 212 may be connected with a part pad where a plurality of ICs and drivers are disposed. Although not illustrated, the circuit pattern 212 according to the exemplary embodiment may further include an electrode pad connected with another flexible printed circuit board.

The coverlay 200 according to the exemplary embodiment can minimize permeation of foreign particles into the circuit pattern 212 and the electrode pad 211. In addition, the coverlay 220 can prevent the circuit pattern 212 from being broken. In addition, the coverlay 220 may insulate an electrical connection between adjacent circuit patterns 212.

The coverlay 220 may overlap at least a part of the circuit pattern 212, and may not overlap the electrode pad 211. According to FIG. 3, the coverlay 220 may have a shape spaced apart from the electrode pad 211 on a plane. When the coverlay 220 overlaps the electrode pad 211, an anisotropic conductive wire, which will be described later, may not be easily attached or a short-circuit may occur between wires.

The coverlay 220 according to the exemplary embodiment may include a body portion 221 and a protrusion portion 222. The protrusion portion 222 protrudes from the body portion 221 with reference to a virtual reference line VL1. The coverlay 220 may be attached onto the base film 210 with reference to the virtual reference line VL1.

The protrusion portion 222 may overlap at least a part of the circuit pattern 212, but the inventive concepts are not so limited. The protrusion portion 222 may be distanced from the circuit pattern 212 on a plane.

The cover 220 according to the exemplary embodiment may include a plurality of protrusions 222. The plurality of protrusion portions 222 may be disposed to have a predetermined interval, but are not so limited, and may be disposed in various forms. The number of protrusion portions 222 may be selected appropriately for adherence of the coverlay 220 and even application of a cover resin, which will be described later. For example, when the cover resin is dropped on n positions, the number of protrusion portions 222 may be n or may have a number similar to n.

Referring to FIG. 5 and FIG. 6, together with the above-described drawings, the flexible printed circuit board 200 according to the exemplary embodiment may be connected with the above-described pad portion PP1 of the display panel or the pad portion PP1 of the touch panel through an anisotropic conductive film 231.

The electrode pad 211 of the flexible printed circuit board 200 may be disposed to face toward the pad portion PP1 of the touch panel or the touch panel, and the anisotropic conductive film 231 may be provided between the electrode pad 211 and the pad portion PP1. One side of the anisotropic conductive film 231 is coupled with the flexible printed circuit board 200, and the other side of the anisotropic conductive film 231 may be coupled with the pad portion PP1 of the touch panel or the display panel.

The anisotropic conductive film 231 may include an adhesive resin and a conductive ball. When heat and pressure are applied, the density of the conductive ball increases such that the electrode pad 211 and the pad portion PP1 can be electrically connected.

The flexible printed circuit board 220 according to the exemplary embodiment may further include a cover resin 232. The cover resin 232 can prevent permeation of moisture or foreign particles into the flexible printed circuit board 200.

The cover resin 232 may overlap at least a part of the circuit pattern 212 and the protrusion portion 222 of the coverlay 220. The cover resin 232 may contact a side surface of the anisotropic conductive film 231 while covering the exposed circuit pattern 212. The cover resin 232 covers the cover circuit 212, which is not covered by the coverlay 220. In addition, the cover resin 232 is also disposed between adjacent protrusion portions 222. An end of the cover resin 232 according to the exemplary embodiment may be aligned with an end of the body portion 221. That is, the cover resin 230 can completely cover an area exposed by the coverlay 220.

The cover resin 232 may include not only a plastic resin but also any material among an organic material and an inorganic material. The cover resin 232 may be provided through various methods, but may be formed by dropping and applying the solution on the base film 210 and curing the solution.

In this case, the solution for forming the cover resin 232 may be dropped between adjacent protrusion portions 222. Alternatively, the solution for forming the cover resin 232 may be dropped on the protrusion portion 222 depending on exemplary embodiments. Accordingly, the solution can be evenly provided even between adjacent protrusion portions 222. The flexible printed circuit board 200 according to the exemplary embodiment may include the cover resin 232 that is evenly formed without having an exposed portion. The flexible printed circuit board 200 may effectively block moisture or foreign particles, thereby increasing the reliability of the device.

Figure 7:
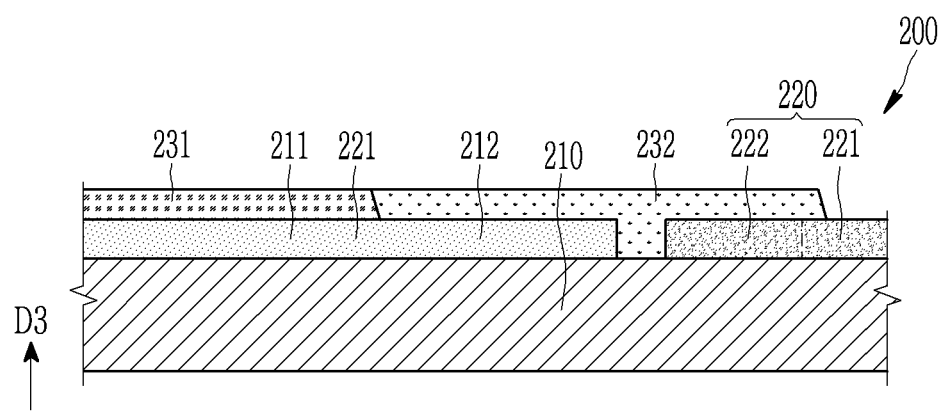
FIG. 7 is a cross-sectional view of a flexible printed circuit board according to an exemplary embodiment of the present invention.

Hereinafter, a flexible printed circuit board according to an exemplary embodiment will be described with reference to FIG. 7. FIG. 7 is a cross-sectional view of some constituent elements of a flexible printed circuit board according to an exemplary embodiment. Description of constituent elements that are similar to the above-described constituent elements will be omitted.

Referring to FIG. 7, in a flexible printed circuit board 200 according to an exemplary embodiment, a cover resin 232 may overlap a coverlay 220. In particular, the cover resin 232 may overlap not only a protrusion portion 222 but also a body portion 221.

In a process for applying a solution for forming the cover resin 232, the solution may be provided between adjacent protrusion portions 222 or on the protrusion portion 222. In this case, the solution remains on the protrusion portion 222 and may also overlap the body portion 221. The cover resin 232 formed through a curing process of the solution may overlap the protrusion portion 222 and at least a part of the body portion 221. The cover resin 232 overlaps at least a part of the body portion 221 such that permeation of moisture or foreign particles may be more stably prevented.

Figure 8:
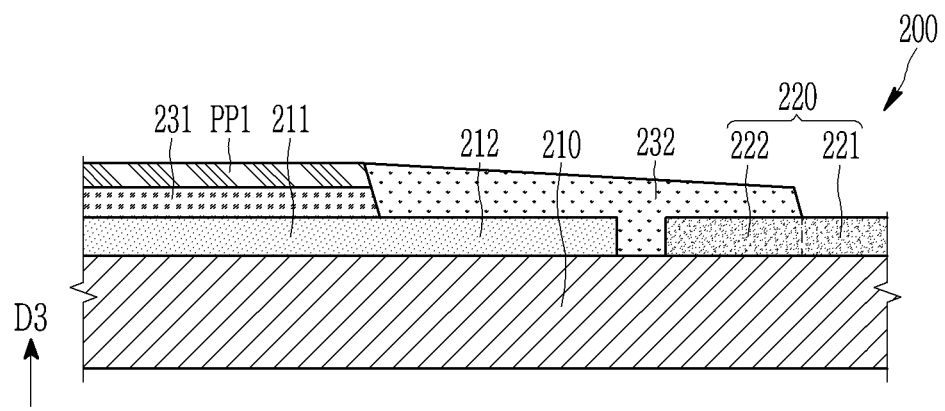
FIG. 8 is a cross-sectional view of the flexible printed circuit board where a touch pad is attached according to the exemplary embodiment of the present invention.

Hereinafter, referring to FIG. 8, an exemplary embodiment in which a touch pad is attached to a flexible printed circuit board will be described. FIG. 8 is a cross-sectional view of a configuration where a touch pad is attached to a flexible printed circuit board according to an exemplary embodiment. Description of constituent elements that are similar to the above-described constituent elements will be omitted.

A flexible printed circuit board 200 according to an exemplary embodiment may be connected with a pad portion PP1 through an anisotropic conductive film 231 that is the same as described above. The pad portion PP1 may include electrodes for transmitting a signal to a display panel, or electrodes for receiving a signal at a touch panel.

The pad portion PP1 may contact the anisotropic conductive film 231, and may be electrically connected with an electrode pad 221 of the flexible printed circuit board 200 through the anisotropic conductive film 231.

A cover resin 232 according to the exemplary embodiment may not only cover an exposed portion of a circuit pattern 212, but may also cover an exposed side surface of the anisotropic conductive film 231 and a side portion of the pad portion PP1. The cover resin 232 covers not only the circuit pattern 212, but also covers the side surfaces of the anisotropic conductive film 231 and pad portion PP1 such that permeation of moisture or foreign particles can be prevented.

Figure 9:
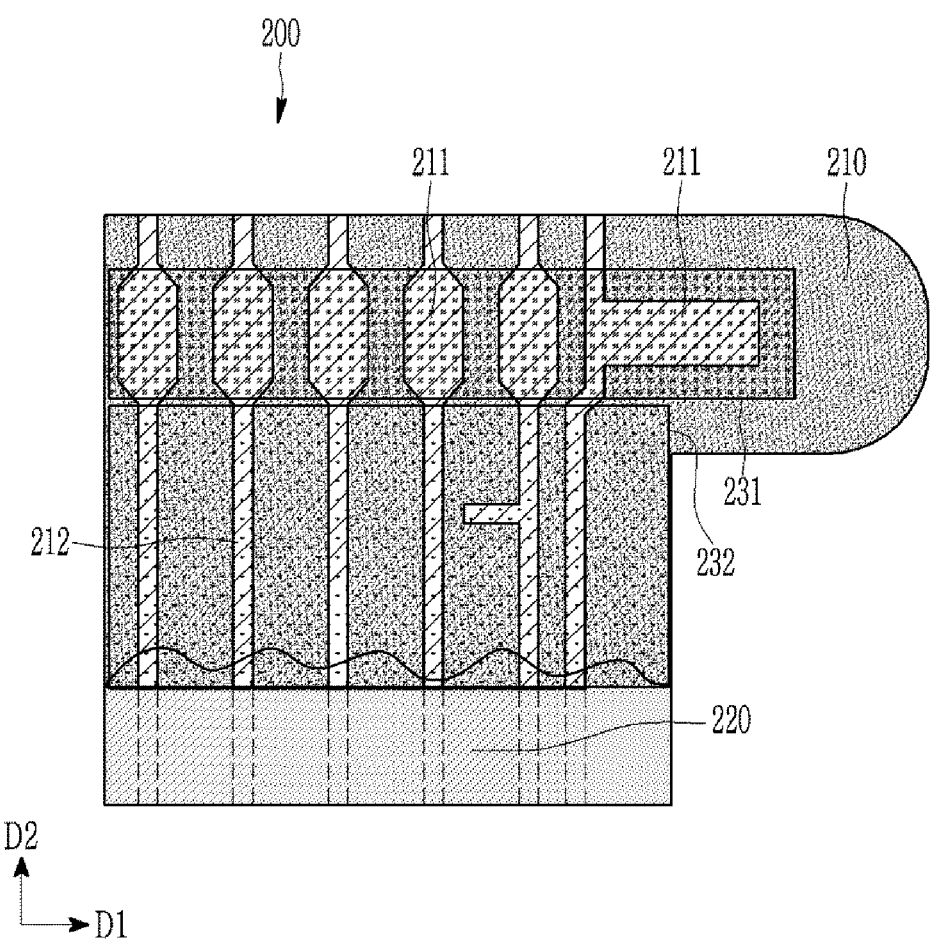
FIG. 9 shows some area of the display device according to a comparative example.

Hereinafter, a flexible printed circuit board according to a comparative example will be described. FIG. 9 shows some area of a display device according to a comparative example. The constituent elements represented by each reference numeral are the same as the constituent elements described above.

When a solution is applied to form a cover resin 232 according to a comparative example, an empty space may be formed between locations where the solution is dropped. As shown in FIG. 9, the solution may not be located between drop points. In this case, the cover resin 232 may have protrusions and depressions on a plane, and a circuit pattern 212 not covered by the cover resin 232 may be exposed to moisture or foreign particles.

However, a flexible printed circuit board according to the exemplary embodiment includes a coverlay that includes protrusion portions. In this case, a solution for forming the cover resin 232 may be dropped between adjacent protrusion portions or dropped on the protrusion portions such that the solution can be evenly applied. The cover resin 232 formed through a solution having excellent spreadability can be provided in an even form without exposing the circuit pattern 212, and can prevent permeation of moisture or foreign particles into the flexible printed circuit board.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A flexible printed circuit board comprising: a base film; an electrode pad disposed on one side of the base film; a circuit pattern connected with the electrode pad; a coverlay overlapping at least a part of the circuit pattern; and a cover resin overlapping the circuit pattern and at least a part of the coverlay, wherein the coverlay comprises a body portion and a protrusion portion protruded from the body portion along an extending direction of the circuit pattern in a plan view, wherein the cover resin is distanced spaced apart from the electrode pad on a plane in a plan view.

2. The flexible printed circuit board of claim 1, wherein the cover resin overlaps the protrusion portion.

3. The flexible printed circuit board of claim 2, wherein the cover resin overlaps at least a part of the body portion.

4. The flexible printed circuit board of claim 1, wherein at least a part of the circuit pattern overlaps the coverlay.

5. The flexible printed circuit board of claim 1, wherein the coverlay comprises a plurality of protrusion portions.

6. The flexible printed circuit board of claim 5, wherein the plurality of protrusion portions are disposed apart from each other at regular intervals.

7. The flexible printed circuit board of claim 1, wherein the coverlay is spaced apart from the electrode pad in a plan view.

8. A display device comprising:
a display panel including a display area and a non-display area; and
a flexible printed circuit board coupled with the display panel in the non-display area,
wherein:

the flexible printed circuit board comprises:
    a base film;
    an electrode pad disposed on one side of the base film;
    a circuit pattern connected with the electrode pad;
    a coverlay overlapping at least a part of the circuit pattern; and
    a cover resin overlapping the circuit pattern and at least a part of the coverlay; and
the coverlay comprises a body portion and a protrusion portion protruded from the body portion.

9. The display device of claim 8, wherein the display panel comprises a pad portion located in the non-display area, and the pad portion is electrically connected with the electrode pad.

10. The display device of claim 9, further comprising an anisotropic conductive film located between the pad portion and the electrode pad.

11. The display device of claim 10, wherein the anisotropic conductive film is spaced apart from the cover resin in a plan view.

12. The display device of claim 10, wherein the anisotropic conductive film is spaced apart from the coverlay in a plan view.

13. The display device of claim 8, wherein the cover resin overlaps the protrusion portion.

14. The display device of claim 13, wherein the cover resin overlaps at least a part of the body portion.

15. The display device of claim 8, wherein at least a part of the circuit pattern overlaps the coverlay.

16. The display device of claim 8, wherein the coverlay comprises a plurality of protrusion portions.

17. A display device comprising:
    a touch panel comprising a touch area and a peripheral area; and
    a flexible printed circuit board coupled with the touch panel in the peripheral area,
    wherein:
    the flexible printed circuit board comprises:
        a base film;
        an electrode pad disposed on one side of the base film;
        a circuit pattern connected with the electrode pad;
        a coverlay overlapping at least a part of the circuit pattern; and
        a cover resin overlapping the circuit pattern and at least a part of the coverlay; and
    the coverlay comprises a body portion and a protrusion portion protruded from the body portion.

18. The display device of claim 17, wherein the touch panel comprises a pad portion located in the peripheral area, and the pad portion is electrically connected with the electrode pad.

19. The display device of claim 18, further comprising an anisotropic conductive film disposed between the pad portion and the electrode pad.

* * * * *